(12) United States Patent
Sosa Cortes et al.

(10) Patent No.: US 8,835,266 B2
(45) Date of Patent: Sep. 16, 2014

(54) METHOD AND STRUCTURE FOR COMPOUND SEMICONDUCTOR CONTACT

(75) Inventors: Norma E. Sosa Cortes, New York, NY (US); Edward W. Kiewra, Verbank, NY (US); Masaharu Kobayashi, Yorktown Heights, NY (US); Kuen-Ting Shiu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 277 days.

(21) Appl. No.: 13/085,511

(22) Filed: Apr. 13, 2011

(65) Prior Publication Data

US 2012/0261718 A1    Oct. 18, 2012

(51) Int. Cl.
| | | |
|---|---|---|
| H01L 21/336 | (2006.01) | |
| H01L 29/66 | (2006.01) | |
| H01L 29/78 | (2006.01) | |
| H01L 29/417 | (2006.01) | |

(52) U.S. Cl.
CPC .... *H01L 29/66522* (2013.01); *H01L 29/66636* (2013.01); *H01L 29/7838* (2013.01); *H01L 29/41783* (2013.01); *H01L 29/7848* (2013.01); *H01L 29/66628* (2013.01)
USPC ............. 438/300; 257/E21.409; 257/E29.079

(58) Field of Classification Search
CPC ...................... H01L 29/66636; H01L 29/7848; H01L 21/823807; H01L 21/02532; H01L 21/76259; H01L 29/41783; H01L 21/0245
USPC .......................................................... 438/300
See application file for complete search history.

(56) References Cited

U.S. PATENT DOCUMENTS

| | | | |
|---|---|---|---|
| 6,121,100 A | 9/2000 | Andideh et al. | |
| 6,887,762 B1 * | 5/2005 | Murthy et al. | 438/300 |
| 7,368,358 B2 * | 5/2008 | Ouyang et al. | 438/299 |
| 7,479,432 B2 * | 1/2009 | Murthy et al. | 438/300 |
| 7,592,214 B2 * | 9/2009 | Ohta | 438/199 |
| 7,732,285 B2 | 6/2010 | Sell et al. | |
| 8,058,133 B2 * | 11/2011 | Tsai et al. | 438/300 |
| 2002/0197803 A1 * | 12/2002 | Leitz et al. | 438/285 |
| 2004/0005740 A1 * | 1/2004 | Lochtefeld et al. | 438/149 |
| 2006/0273347 A1 * | 12/2006 | Hikita et al. | 257/192 |
| 2007/0004123 A1 * | 1/2007 | Bohr et al. | 438/230 |
| 2008/0001173 A1 * | 1/2008 | Kiewra et al. | 257/194 |
| 2008/0006854 A1 | 1/2008 | Luo et al. | |
| 2008/0142840 A1 | 6/2008 | Lindert et al. | |
| 2008/0237741 A1 * | 10/2008 | Ranade et al. | 257/401 |
| 2009/0302348 A1 * | 12/2009 | Adam et al. | 257/190 |
| 2010/0289062 A1 * | 11/2010 | Pillarisetty et al. | 257/192 |
| 2012/0021583 A1 * | 1/2012 | Wu et al. | 438/300 |
| 2012/0161105 A1 * | 6/2012 | Rachmady et al. | 257/19 |

OTHER PUBLICATIONS

Shaw, D., "Localized GaAs Etching with Acidic Hydrogen Peroxide Solutions", Journal of the Electrochemical Society, 1981, vol. 128, No. 4, pp. 874-880.

* cited by examiner

*Primary Examiner* — Wael Fahmy
*Assistant Examiner* — Sarah Salerno
(74) *Attorney, Agent, or Firm* — Scully, Scott, Murphy & Presser, P.C.; Daniel Schnurmann

(57) ABSTRACT

The present disclosure provides a buried channel semiconductor structure in which a crystallographic wet etch is used to tailor the profile of etched regions formed into a multilayered substrate which includes a compound semiconductor layer located atop a buried semiconductor channel material layer. The use of crystallographic wet etching on a compound semiconductor allows one to tailor the shape of a source recess region and a drain recess region formed into a multi-layered substrate. This allows for the control of gate overlap/underlap. Also, the use of crystallographic wet etching on a compound semiconductor allows independent control of the length of an underlying buried semiconductor channel region.

22 Claims, 2 Drawing Sheets

METHOD AND STRUCTURE FOR COMPOUND SEMICONDUCTOR CONTACT

BACKGROUND

The present disclosure relates to a semiconductor structure and a method of fabricating the same. More particularly, the present disclosure relates to a semiconductor structure including a buried semiconductor channel region positioned between a portion of a raised source region and a portion of a raised drain region both raised regions having wall profiles that are tailored to control gate overlap and gate underlap. The present disclosure also provides a method of fabricating such a semiconductor structure.

In modern integrated circuit manufacture, semiconductor devices, such as field effect transistors (FETs), are typically formed on a Si-containing substrate. In a typical FET, a source and a drain are formed in an active region of the Si-containing substrate by implanting n-type or p-type impurities in the semiconductor material. Disposed between the source and the drain is a channel (or body) region. Disposed above the body region is a gate electrode. The gate electrode and the body are spaced apart by a gate dielectric layer.

The FET contact resistance often limits device performance by decreasing speed, increasing Joule heating, and degrading device reliability. Contact resistance is often improved by heavily doping the source region and the drain region via ion implantation. Despite improving the contact resistance, the aforementioned technique causes crystal damage, gate dielectric degradation, and current leakage paths.

Selectively grown raised source regions and drain regions (oftentimes referred as "RSD") are promising candidates for replacing ion implantations, however, RSD regions must contact the channel and they must overlap (underlap) the gate region.

In view of the above, there is a continued need to provide a semiconductor device such as a FET in which the contact resistance thereof is reduced without using ion implantations and conventional RSD regions to obtain the improvement in contact resistance.

SUMMARY

The present disclosure provides a buried channel semiconductor structure in which a crystallographic wet etch is used to tailor the profile of etched regions formed into a multilayered substrate which includes a compound semiconductor layer located atop a buried semiconductor channel material layer. Specifically, applicants have determined that the crystallographic wet etching of a compound semiconductor layer allows one to tailor the shape of a source recess region and a drain recess region formed into the multilayered substrate without the need of first implanting the regions prior to etching. This allows for the control of gate overlap/underlap. Also, the crystallographic wet etching of a compound semiconductor layer allows independent control of the length of an underlying buried semiconductor channel region. Further, the crystallographic wet etching of a compound semiconductor layer allows one to be able to optimize the sidewall shape of the source recess region and the drain recess region for maximum contact to the channel region. Moreover, the crystallographic wet etching of a compound semiconductor layer allows one to provide a structure having low contact resistance via epitaxial deposition of a highly doped material in lieu of an ion implantation process.

In one aspect of the present disclosure, a method of forming a semiconductor structure is provided that includes providing a multilayered substrate comprising, from bottom to top, a semiconductor substrate, a buried semiconductor channel material layer and a compound semiconductor layer. A patterned gate region is then formed on an upper surface of the compound semiconductor layer. A crystallographic wet etch is then performed utilizing at least the patterned gate region as an etch mask to provide a source recess region having a slanted wall profile and a drain recess region having a slanted wall portion in portions of the multilayered substrate that are adjacent to the patterned gate region. A raised source region is formed within the source recess region and a raised drain region is formed within the drain recess region, wherein both the raised source region and the raised drain region have an upper surface that is offset from an upper surface of the multilayered substrate.

In another aspect of the present disclosure, a semiconductor structure is provided. The semiconductor structure of the present disclosure includes a patterned gate region located on an upper surface of a multilayered substrate, the multilayered substrate comprising, from bottom to top, a semiconductor substrate, a buried semiconductor channel material layer and a compound semiconductor layer; and a raised source region and a raised drain region located in areas of the multilayered substrate that are at a footprint of the patterned gate region, wherein the raised source region and the raised drain region each have slanted wall profiles within the multilayered substrate, and the slanted wall profiles determine a channel length of a buried semiconductor channel region that is located beneath the patterned gate region and between the raised source region and the raised drain region.

The buried semiconductor channel structure of the present disclosure described above differs from surface channel devices in that the current transfer in the buried semiconductor channel structure of the present disclosure occurs at a level below the semiconductor/gate dielectric interface. In the present structure, the buried semiconductor is separated from the gate dielectric by the compound semiconductor layer mentioned above. Since the compound semiconductor layer can be made thin, the structure disclosed herein can be switched on and off relatively fast.

DETAILED DESCRIPTION

The present disclosure, which provides a semiconductor structure including a buried semiconductor channel region positioned between a portion of a raised source region and a raised drain region which both have wall profiles that are tailored for controlling gate overlap and gate underlap and a method of fabricating the same, will now be described in greater detail by referring to the following discussion and drawings that accompany the present application. It is noted that the drawings are provided for illustrative purposes only and are not drawn to scale.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
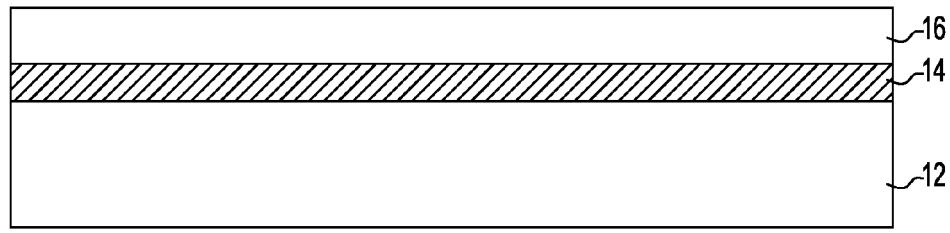
FIG. 1 is a pictorial representation (through a cross sectional view) depicting an initial structure, e.g., a multilayered substrate, including, from bottom to top, a semiconductor substrate, a buried semiconductor channel material layer, and a compound semiconductor layer.

Referring to FIG. 1, there is illustrated an initial structure 10, e.g., multilayered substrate, that can be employed in one embodiment of the present disclosure. The initial structure 10 includes, from bottom to top, a semiconductor substrate 12, a buried semiconductor channel material layer 14 and a compound semiconductor layer 16.

The semiconductor substrate 12 of the initial structure 10 may comprise any semiconductor material including, but not limited to Si, SiGe, SiGeC, SiC, Ge alloys, GaSb, GaP, GaAs, InAs, InP, and all other III-V or II-VI compound semiconductors. In one embodiment, semiconductor substrate 12 is typically an III-V or II-VI compound semiconductor. In some embodiments, the semiconductor substrate 12 is a bulk semiconductor. In other embodiments, the semiconductor substrate 12 may comprise a layered semiconductor material such as, for example, a semiconductor-on-insulator or a semiconductor on a polymeric, thin, and or flexible substrate. Illustrated examples of semiconductor-on-insulator substrates that can be employed as semiconductor substrate 12 include silicon-on-insulators and silicon-germanium-on-insulators.

In some embodiments in which semiconductor substrate 12 is not a compound semiconductor material (such as, for example, Si or Ge), a buffer layer (not shown) would be formed between the semiconductor substrate 12 and the buried semiconductor material layer 14. When present, the buffer layer comprises a compound semiconductor material which may be the same or different from that of the compound semiconductor layer 16. The buffer layer can be formed utilizing one of the techniques mentioned below for the compound semiconductor layer 16.

The semiconductor substrate 12 may be doped, undoped or contain doped and undoped regions therein. The semiconductor substrate 12 may have a single crystal orientation or it may have surface regions that have different crystal orientations. The semiconductor substrate 12 may be strained, unstrained or the semiconductor substrate 12 may contain both strained regions and unstrained regions therein.

The initial structure 10 illustrated in FIG. 1 also includes a buried semiconductor channel material layer 14 located on an upper surface of the semiconductor substrate 12. In one embodiment of the present disclosure, the buried semiconductor channel material layer 14 comprises a semiconductor material that is different, in terms of its composition, than the semiconductor material of the underlying semiconductor substrate 12. In yet another embodiment of the present disclosure, the buried semiconductor channel material layer 14 comprises a semiconductor material that has a different (i.e., higher or lower) dopant concentration than that of the underlying semiconductor substrate 12. The term "semiconductor material" as used in connection with the buried semiconductor channel material layer 14 includes one of the semiconductor materials mentioned above in connection with the semiconductor substrate 12. In one embodiment, the buried semiconductor channel material layer 14 comprises an III-V or II-VI compound semiconductor, which is different in terms of its composition or doping concentration as compared to semiconductor substrate 12.

The buried semiconductor channel material layer 14 can be formed by utilizing an epitaxial growth process including, but not limited to molecular beam epitaxy and liquid phase epitaxy. Since an epitaxy growth process can be employed in forming the buried semiconductor channel material layer 14, the buried semiconductor channel material layer 14 has an epitaxial relationship to the underlying semiconductor substrate 12 either directly or via an appropriate buffer layer. That is, since the semiconductor substrate 12 acts as a seed crystal, the buried semiconductor channel material layer 14 takes on a lattice structure and orientation identical to those of the semiconductor substrate 12. The resulting layer 14 is of typical 'commercial quality'. By "typical commercial quality" it is meant that the compound semiconductor layer 14 typically has a defect density on the order of about $10^5$ atoms/cm$^2$ or less, with a defect density of less than about 5000 atoms/cm$^2$ being more typical.

The thickness of the buried semiconductor channel material layer 14 can vary depending on the type of semiconductor material employed as well as the technique that is used in forming the same. Typically, the buried semiconductor channel material layer 14 has a thickness from 0.5 nm to 20 nm, with a thickness from 5 nm to 10 nm being more typical. The buried semiconductor channel material layer 14 can also have other thicknesses besides those mentioned herein.

The initial structure 10 illustrated in FIG. 1 also includes a compound semiconductor layer 16 positioned on an upper surface of the buried semiconductor channel material layer 14. The compound semiconductor layer 16 that is employed in the present disclosure has a higher band-gap than the underlying buried semiconductor channel material layer 14.

As such, the compound semiconductor layer 16 employed in the present disclosure behaves more as an insulator in the disclosed structure than the underlying buried semiconductor channel material layer 14. In one embodiment, the compound semiconductor layer 16 is comprised of a different compound semiconductor material as compared to the buried semiconductor channel layer 14.

The term "compound semiconductor" as used in connection with compound semiconductor layer 16 denotes a semiconductor material that includes at least one element from Group III of the Periodic Table of Elements and at least one element from Group V of the Periodic Table of Elements, or a semiconductor material that includes at least one element from Group II of the Periodic Table of Elements and at least one element from Group VI of the Periodic Table of Elements. Typically, the compound semiconductors are binary, ternary or quaternary alloys including III/V elements or II/VI. Examples of III-V compound semiconductors that can be used in the present disclosure as layer 16 include, but are not limited to alloys of GaAs, InAs, InP, InGaAs, InAlAs, InAlAsSb, InAlAsP and InGaAsP. Examples of II/VI compound semiconductors that can be used in the present disclosure as layer 16 include, but are not limited to alloys of CdTe, CdS, CdSe, ZnTe, ZnS, ZnSe, $Hg_{1-x}Zn_xTe$ and $Cd_{1-x}Zn_xTe$. In one embodiment, the compound semiconductor layer 16 can be a binary compound semiconductor, with GaAs being highly preferred in some embodiments.

The compound semiconductor layer 16 employed in the present disclosure is a single crystal material of typical 'commercial quality'. By "typical commercial quality" it is meant that the compound semiconductor layer 16 typically has a defect density on the order of about $10^5$ atoms/cm$^2$ or less, with a defect density of less than about 5000 atoms/cm$^2$ being more typical.

The compound semiconductor layer 16 can be formed utilizing an epitaxial growth process. Since epitaxy is employed, the compound semiconductor layer 16 has an epitaxial relationship with the underlying buried semiconductor channel material layer 14. The thickness of the compound semiconductor layer 16 can vary depending on the type of compound semiconductor material employed, as well as the conditions of the epitaxial growth process employed. Typically, the compound semiconductor layer 16 has a thickness from 0.5 nm to 5 nm, with a thickness from 1 nm to 2 nm being more typical. The compound semiconductor layer 16 can also have other thicknesses besides those mentioned in the present disclosure.

In some embodiments of the present disclosure, substrate 12 and layers 14 and 16 are comprised of different compound semiconductor materials. In yet another embodiment, substrate 12 and compound semiconductor layer 16 are comprised of the same compound semiconductor, while buried semiconductor channel layer 14 is comprised of a different compound semiconductor material than substrate 12 and compound semiconductor layer 16.

After providing the compound semiconductor layer 16, the compound semiconductor layer 16 is typically, but not necessarily always cleaned. One of the many available cleaning processes, that may or may not be used, can include various solvents to remove contaminates and/or surface oxides from the surface of the compound semiconductor layer 16.

Figure 2:
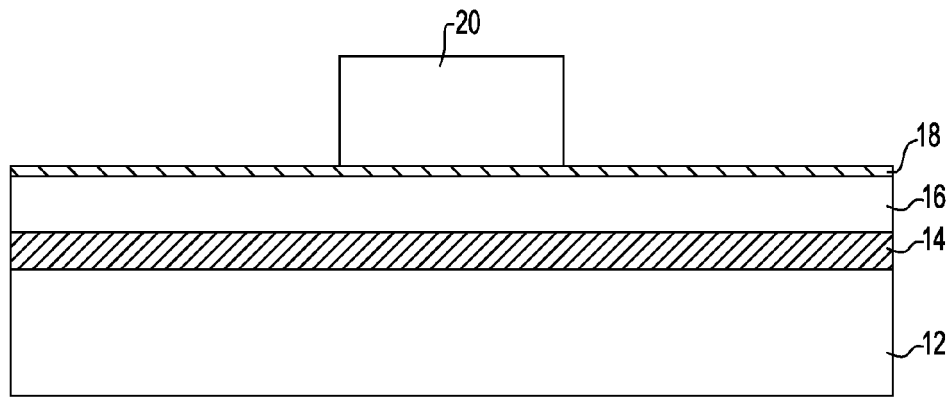
FIG. 2 is a pictorial representation (through a cross sectional view) depicting the initial structure of FIG. 1 after forming a dielectric material layer on an upper surface of the compound semiconductor layer and after forming a patterned gate conductor on an upper surface of the dielectric material layer.

Referring now to FIG. 2, there is illustrated the structure of FIG. 1 after forming a dielectric material layer 18 atop the compound semiconductor layer 16; a patterned portion of dielectric material layer 18 will serve as a gate dielectric of a transistor to be subsequently formed. The dielectric material layer 18 employed in the present disclosure has a dielectric constant of equal to, or greater than silicon dioxide, i.e., 4.0. All dielectric constants mentioned herein are relative to a vacuum unless otherwise stated. In some embodiments, the dielectric material layer 18 has a dielectric constant of about 7.0 or greater, with a dielectric constant of about 10.0 or greater being even more typical.

The dielectric material layer 18 employed in the present disclosure includes, but is not limited to an oxide, nitride, oxynitride and/or silicate including metal silicates, aluminates, titanates and nitrides. A multilayered dielectric material layer stack can also be employed in this disclosure as dielectric material layer 18. In one embodiment, the dielectric material layer 18 can comprise a compound semiconductor oxide, compound semiconductor nitride and/or a compound semiconductor oxynitride. In another embodiment, the dielectric material layer 18 can be comprised of $HfO_2$, $ZrO_2$, $Al_2O_3$, $TIO_2$, $La_2O_3$, $SrTiO_3$, $LaAlO_3$, $Y_2O_3$, a pervoskite oxide, hafnium silicon oxide, hafnium aluminum oxide or hafnium aluminum nitride.

In one embodiment of the present disclosure, the dielectric material layer 18 can be formed on an upper surface of the compound semiconductor layer 16 by utilizing a thermal process such as, for example, thermal oxidation or thermal nitridation. In another embodiment of the present disclosure, the dielectric material layer 18 can be formed by a deposition process including, but not limited to molecular beam epitaxy (MBE), chemical vapor deposition (CVD), plasma enhanced chemical vapor deposition (PECVD), atomic layer deposition (ALD), evaporation, physical vapor deposition (PVD), chemical solution deposition and other like deposition processes.

The thickness of the dielectric material layer 18 may vary depending on the technique employed in fabricating the same as well as the composition and number of dielectrics of the dielectric material layer 18. Typically, the dielectric material layer 18 has a thickness from 0.5 to 20 nm, with a thickness from 1 to 10 nm being more typical.

After forming the dielectric material layer 18 on an upper surface of the compound semiconductor layer 16, a patterned gate conductor 20 is formed atop portions of the dielectric material layer 18. The resultant structure including the patterned gate conductor 20 is also shown in FIG. 2.

The patterned gate conductor 20 includes any conductive material such as, but not limited to, polysilicon, silicon germanium, conductive metals, conductive metal alloys, conductive silicides, conductive nitrides and combinations or multilayers thereof. When metallic-containing conductive materials are employed as the conductive material, the metallic conductive material can be doped so as to shift the work function of the conductive material. Illustrative examples of dopant ions include As, P, B, Sb, Bi, Al, Ga, Tl or mixtures thereof. The same dopants are also used with polysilicon or SiGe mentioned above. In some embodiments, the patterned gate conductor 20 is composed of a conductive metal, with Al, Pt, Au, W and Ti being preferred in some cases. The selection of conductive metals as the conductive material for the patterned gate conductor 20 is advantageous in some instances since conductive metals have different work functions that permit one to adjust the threshold voltage of the device.

The patterned gate conductor 20 can be formed by first forming a blanket layer of a conductive material on an upper surface of the dielectric material layer 18. The blanket layer of conductive material can be formed by a deposition process such as, for example, CVD, PECVD, PVD, plating, thermal or ebeam evaporation and sputtering. The thickness of the blanket layer of the conductive material may vary depending on the type of conductive material employed, as well as the processing technique used to form the same. Typically, the blanket layer of conductive material has a thickness from 50 to 200 nm, with a thickness from 100 to 150 nm being even more typical.

In some embodiments (not shown), an optional hard mask can be formed atop the surface of the blanket layer of conductive material. When present, the optional hard mask can be comprised of an oxide, nitride or oxynitride, with oxides of silicon and/or nitrides of silicon being highly typical. The hard mask, if present, can be formed utilizing a conventional deposition process including, but not limited to CVD, PECVD, ALD, and chemical solution deposition. Alternatively, the hard mask can be formed by a thermal oxidation and/or nitridation process.

The thickness of the optional hard mask, if present, may vary depending on the material of the hard mask, as well as the processing technique used to form the same. Typically, the optional hard mask has a thickness from 50 Å to 1000 Å, with a thickness from 100 Å to 500 Å being more typical.

After forming the blanket layer of conductive material, at least the blanket layer of conductive material is patterned into the patterned gate conductor 20. The patterning of at least the blanket layer of conductive material can be performed utilizing lithography and etching. The lithographic step includes applying a photoresist (not shown) atop the optional hard mask, if present, or atop the blanket layer of conductive material, if the hard mask is not present, exposing the photoresist to a pattern of radiation and thereafter developing the exposed photoresist utilizing a conventional resist developer. The pattern within the developed photoresist is then transferred into the underlying material layers utilizing one or more etching steps, including dry etching and/or wet etching. When dry etching is used to transfer the pattern into the underlying layers, one of reactive ion etching, ion bean etching, plasma etching and laser ablation can be used. When wet etching is used, a chemical etchant that selectively removes portions of the conductive material can be employed. The transfer of the pattern may first be into the hard mask, followed by resist removal and continued etching into at least the blanket layer of conductive material. The etching can stop atop the dielectric material layer 18. The resist is removed during or after the pattern transfer process by a conventional resist removal step such as, for example, ashing.

Figure 3:
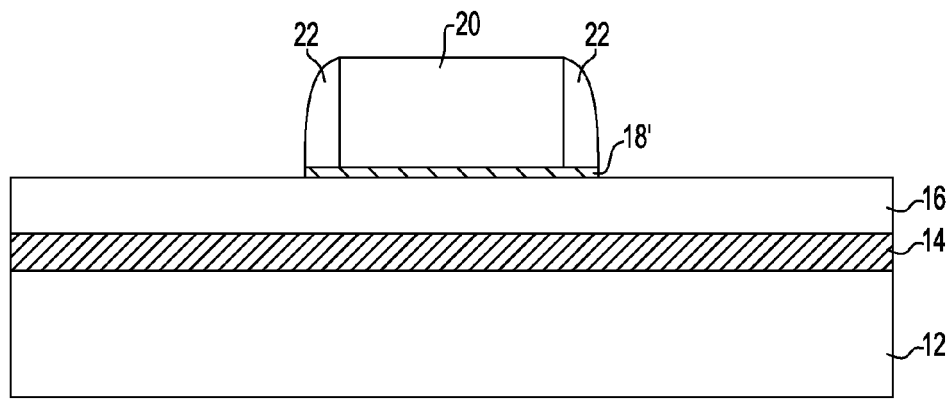
FIG. 3 is a pictorial representation (through a cross sectional view) depicting the structure of FIG. 2 after forming at least one spacer on a sidewall of the patterned gate conductor and atop a remaining portion of the dielectric material layer.

Referring now to FIG. 3, there is illustrated the structure of FIG. 2 after forming at least one spacer 22. The at least one spacer 22, which is typically formed directly on an exposed sidewall of the patterned gate conductor 20, can be formed utilizing a conventional deposition process, followed by etching (wet and/or dry etching). During the etching step, or in a subsequent etching step, portions of the dielectric material layer 18 can be etched as well forming patterned dielectric material layer 18'; the patterned gate conductor 20 and the patterned dielectric material 18' collectively can be referred to herein as a patterned gate region. The at least one spacer 22 may be comprised of an oxide, a nitride and/or an oxynitride. Typically, oxides of silicon and/or nitrides of silicon are used as spacer materials.

Figure 4:
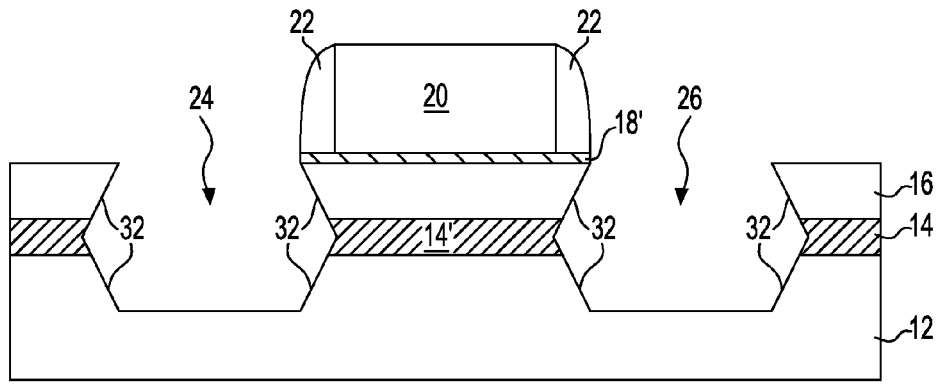
FIG. 4 is a pictorial representation (through a cross sectional view) depicting the structure of FIG. 3 after performing a crystallographic wet etch to form a source recess region having a slanted wall profile and a drain recess region having a slanted wall profile at the footprint of the patterned gate conductor, patterned dielectric material layer and at least one spacer and within portions of the compound semiconductor layer, the buried semiconductor channel material layer and the semiconductor substrate.

Referring now to FIG. 4, there is illustrated the structure of FIG. 3 after performing a crystallographic wet etching process which provides a source recess region 24 having a slanted wall profile 32 and a drain recess region 26 having a slanted wall profile 32 into portions of the compound semiconductor layer 16, the buried semiconductor channel material layer 14, and the semiconductor substrate 12. In FIG. 4, reference numeral 14' is used to denote a buried semiconductor channel region of the structure which comprises a portion of the buried semiconductor material layer 14 that is located beneath the patterned gate region. The crystallographic wet etching employed in the present application does not require a dry etching step to be performed prior to the crystallographic wet etch process. The present application also does not require any other additional preparation step prior to wet etching, i.e., an additional doping step as to induce higher etching rates of the buried semiconductor material layer 14 is not employed. By "slanted wall profile" it is meant the surface of the wall created is oriented at a particular angle (relative to the top surface of layer 16) dictated by the crystallographic planes particular to etchants and etch rate chosen. The 'slant' of the sidewall may be positive sloped, negative sloped, or a combination of both.

Figure 6:
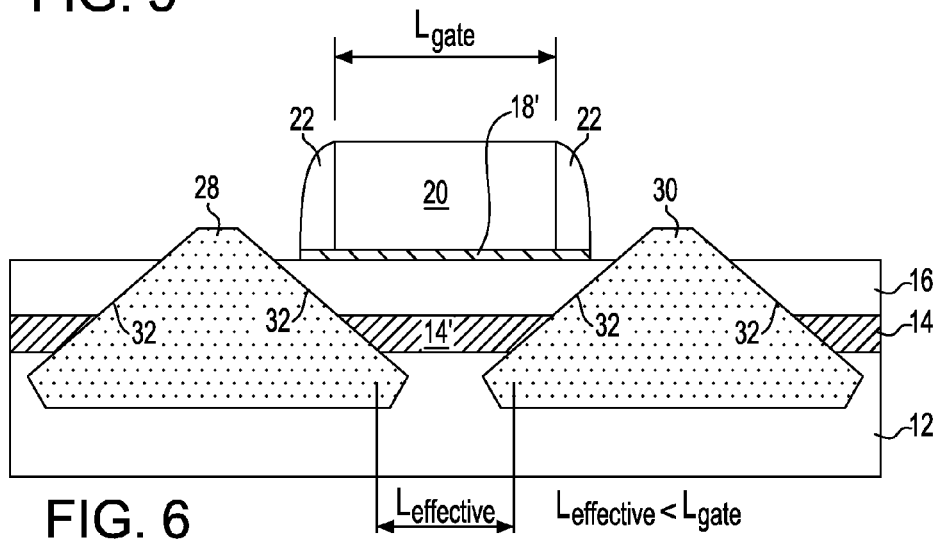
FIG. 6 is a pictorial representation (through a cross sectional view) depicting an alternative structure that can be formed utilizing the basic processing steps of the present disclosure.

In the structure illustrated in FIG. 4, the crystallographic wet etching can be used to form a source recess region 24 and a drain recess region 26 that have slanted walls that intercept at a point within the multilayered substrate which are self-aligned to the outer edges of the patterned gate conductor 20. The crystallographic wet etch of the present disclosure can be tailored to form controlled re-entrant 'dove-tail' type etch grooves in the compound semiconductor layer 16 due to the differential etch rates on various crystallographic planes of the compound semiconductor layer 16, the buried semiconductor channel material layer 14 and the semiconductor substrate 12. In some embodiments, and as shown in FIG. 6, the crystallographic wet etching can be used to form a source recess region 24 and a drain recess region 26 having walls that intercept at a point within the multilayered substrate which are not self-aligned to the outer edges of the patterned gate conductor 20.

As shown, the source recess region 24 and the drain recess region 26 are formed into areas of the compound semiconductor layer 16, the buried semiconductor channel material layer 14, and the semiconductor substrate 12 which are adjacent to (i.e., at the footprint of) the patterned gate conductor 20, the patterned dielectric material 18' and the at least one spacer 22 shown in FIG. 3. As such, the crystallographic wet etching is performed utilizing the patterned gate conductor 20, the patterned dielectric material 18' and the at least one spacer 22 as an etch mask.

Applicants have determined that the crystallographic wet etching of a compound semiconductor allows one to tailor the shape of the source recess region 24 and the drain recess region 26 and thus control gate overlap/underlap of the structure (it is noted that compound semiconductors different from silicon or germanium based semiconductors in that compound semiconductors have orientation etch rates that can be selectively controlled via selection of crystallographic wet etch composition and or concentration of such etchants). Also, the crystallographic wet etching of a compound semiconductor, such as compound semiconductor layer 16, also allows independent control of the length of the underlying buried semiconductor channel region 14'. Further, the crystallographic wet etching of a compound semiconductor allows one to be able to optimize the sidewall shape of the source recess region 24 and the drain recess region 26 for maximum contact to the buried semiconductor channel region 14'. Moreover, the crystallographic wet etching of a compound semiconductor allows one to provide a structure having low contact resistance via epitaxial deposition of highly doped material in lieu of ion implantation process.

The crystallographic wet etching that can be employed in the present disclosure typical utilizes an etchant that includes at least one acid, at least one oxidant and water. The at least one acid of the etchant used in the present disclosure can include an inorganic acid such as, but not limited to $H_2SO_4$, HCl, $H_3PO_4$, HBr and $HNO_3$. The at least one oxidant of the etchant used in the present disclosure can include $H_2O_2$ or $HNO_3$. The water that can be employed in the etchant typically includes distilled water.

In one embodiment, the at least one acid is $H_2SO_4$ and the at least one oxidant is $H_2O_2$. In another embodiment, the at least one acid is HCl and the at least one oxidant is $H_2O_2$.

The etchant that can be employed in the present disclosures includes a ratio of the at least one acid to at least one oxidant to water of from 1:1:1000 to 1:1000:1, with a ratio of the at least one acid to at least one oxidant to water of from 1:10:100 to 1:100:10 being more typical.

In one embodiment of the present disclosure, the crystallographic wet etch can be performed at cool temperatures (>0° C. up to room temperature). In another embodiment of the present disclosure, the crystallographic wet etch can be performed at a temperature from room temperature up to, and including, 150° C.

Figure 5:
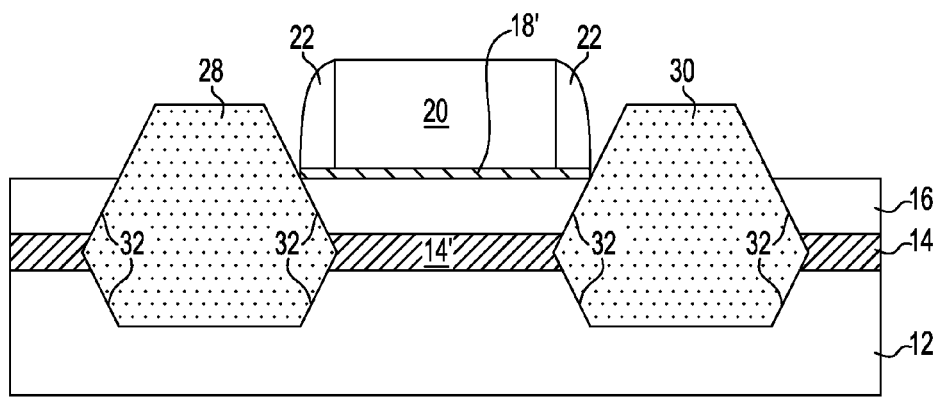
FIG. 5 is a pictorial representation (through a cross sectional view) depicting the structure of FIG. 4 after forming a raised source region in the source recess region and forming a raised drain region in the drain recess region.

Referring now to FIG. 5, there is illustrated the structure of FIG. 4 after formation of raised source region 28 and raised drain region 30. Specifically, the raised source region 28 and the raised drain region 30 are formed by performing an epitaxial growth process in which a semiconductor material is formed which overfills the source recess region 24 and the drain recess region 26. The doping of the raised source region 28 and the raised drain region 30 can be formed in-situ during the epitaxial growth of the semiconductor material. Alternatively, the doping of the raised source region 28 and the raised drain region 30 can be formed after the epitaxial growth of the semiconductor material by ion implantation, gas phase doping or out diffusion of a dopant from a sacrificial material layer include said doping.

The semiconductor material employed in the epitaxial growth process may have the same or different lattice constant as that of the underlying semiconductor substrate 12. In one embodiment, and when the semiconductor substrate 12 comprises single crystal silicon, the semiconductor material of the raised source region 28 and the raised drain region 30 can comprise either pseudomorphically grown SiGe, Si:C (i.e., carbon doped silicon) or epitaxially grown Si. When the semiconductor material of the raised source region 28 and the raised drain region 30 has a different lattice constant than the semiconductor substrate 12, a tensile or compressive stress can be introduced into the structure.

The semiconductor structure that is shown in FIG. 5 includes a patterned gate region (represented by elements 20 and 18') located on an upper surface of a multilayered substrate (i.e., initial structure 10), the multilayered substrate comprises, from bottom to top, a semiconductor substrate 12, a buried semiconductor channel material layer 14 and a compound semiconductor layer 16; and a raised source region 28 and a raised drain region 30 located in areas of the multilayered substrate that are at a footprint of the patterned gate region, wherein the raised source region 28 and the raised drain region 30 each have slanted wall profiles 32 within the multilayered substrate, and wherein the slanted wall profiles 32 determine a channel length, $L_{effective}$, of a buried semiconductor channel region 14' located beneath the patterned gate region and between the raised source region 28 and the raised drain region 30. In this structure $L_{effective}$ is less than $L_{gate}$. Other embodiments can include $L_{effective}$ equal to or more than $L_{gate}$. It is also observed that the raised source region 28 and the raised drain region 30 each have an upper surface that is offset from an upper surface of the multilayered substrate.

Reference is now made to FIG. 6 which illustrates another possible structure that can be formed utilizing the basic processing steps described above. In the structure shown in FIG. 6, the crystallographic wet etching provides a structure in which the resultant recessed source region and drain region are not self-aligned to the outer edge of the patterned gate conductor 20. Instead, the source recess region and the drain recess region underlap the patterned gate conductor 20.

The semiconductor structure that is shown in FIG. 6 includes a patterned gate region (represented by elements 20 and 18') located on an upper surface of a multilayered substrate (i.e., initial structure 10), the multilayered substrate comprises, from bottom to top, a semiconductor substrate 12, a buried semiconductor channel material layer 14 and a compound semiconductor layer 16; and a raised source region 28 and a raised drain region 30 located in areas of the multilayered substrate that are at a footprint of the patterned gate region, wherein the raised source region 28 and the raised drain region 30 each have slanted wall profiles 32 within the multilayered substrate, and wherein the slanted wall profiles 32 determine a channel length, $L_{effective}$, of a buried semiconductor channel region 14' located beneath the patterned gate region and between the raised source region 28 and the raised drain region 30. In this structure $L_{effective}$ is equal to, or greater than, $L_{gate}$. It is also observed that the raised source region 28 and the raised drain region each have an upper surface that is offset from an upper surface of the multilayered substrate.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:

providing a multilayered substrate comprising, from bottom to top, a semiconductor substrate comprising a first compound semiconductor material, a buried semiconductor channel material layer comprising a second compound semiconductor material which is different in terms of composition or doping as compared to the first compound semiconductor material and located on a topmost surface of the semiconductor substrate, and a compound semiconductor layer comprising a third compound semiconductor material having a higher band gap than the second compound semiconductor material and located on a topmost surface of the buried semiconductor channel material layer, wherein said first, second and third compound semiconductor materials are selected from the group consisting of a III-V compound semiconductor material and a II-VI compound semiconductor material;

forming a patterned gate region on a topmost surface of the multilayered substrate;

performing a crystallographic wet etch utilizing at least the patterned gate region as an etch mask to provide a source recess region having slanted wall profiles and a drain recess region having slanted wall profiles in portions of the multilayered substrate that are adjacent to the patterned gate region, wherein no dry etch process is performed prior to said crystallographic wet etch; and forming a raised source region within the source recess region and a raised drain region within the drain recess region, wherein both said raised source region and said raised drain region have an upper horizontal surface that is offset from said topmost surface of the multilayered substrate, a lower horizontal surface that is located beneath said topmost surface of said semiconductor substrate, and a pair of upper slanted sidewalls and a pair of lower slanted sidewalls, and wherein each of said upper slanted sidewalls has an end portion that directly contacts an end portion of one of the lower slanted sidewalls beneath said topmost surface of said buried semiconductor channel material layer.

2. The method of claim 1, wherein said providing the multilayered substrate includes epitaxially growing the buried semiconductor channel material layer on said topmost surface of the semiconductor substrate, and epitaxially growing the compound semiconductor layer on said topmost surface of the buried semiconductor channel material layer.

3. The method of claim 2, wherein said epitaxially growing the buried semiconductor channel material layer includes selecting a semiconductor material having a different semiconductor composition than the semiconductor substrate.

4. The method of claim 2, wherein said performing the crystallographic wet etching includes selecting an etchant comprising at least one acid, at least one oxidant and water.

5. The method of claim 4 wherein said at least one etchant has a ratio of the at least one acid to the at least one oxidant to: water from 1:1:1000 to 1:1000:1.

6. The method of claim 5, wherein said at least one acid is $H_2SO_4$ and said at least one oxidant is $H_2O_2$.

7. The method of claim 5, wherein said at least one acid is HCl and said at least one oxidant is $H_2O_2$.

8. The method of claim 4, wherein said performing the crystallographic wet etching is performed at temperatures near 0° C. or a higher temperature up to, and including, 150° C.

9. The method of claim 1, wherein said providing the patterned gate region comprises forming a dielectric material layer on said topmost surface of the multilayered substrate; forming a blanket layer of a conductive material on an upper surface of the dielectric material layer; patterning the blanket layer of the conductive material into a patterned gate conductor; and etching said dielectric material layer not protected by at least said patterned gate conductor.

10. The method of claim 9, wherein said etching the dielectric material layer is performed during formation of at least one spacer on sidewalls of said patterned gate conductor.

11. The method of claim 9, wherein said etching the dielectric material layer is performed after formation of at least one spacer on sidewalls of said patterned gate conductor.

12. The method of claim 1, wherein said performing the crystallographic wet etching can be tailored to control the slanted wall profiles of the source recess region and the drain recess region and to control a length of a buried semiconductor channel region comprising a remaining portion of said buried semiconductor channel material layer that is located beneath the patterned gate region after said crystallographic wet etching.

13. The method of claim 1, wherein said forming the raised source region and the raised drain region includes epitaxial growth of a semiconductor material, and said epitaxial growth includes selecting a semiconductor material having a same lattice constant as that of the semiconductor substrate.

14. The method of claim 1, wherein said forming the raised source region and the raised drain region includes epitaxial growth of a semiconductor material, and said epitaxial growth includes selecting a semiconductor material having a different lattice constant as that of the semiconductor substrate.

15. A semiconductor structure comprising:
a patterned gate region located on a topmost surface of a multilayered substrate, said multilayered substrate comprising, from bottom to top, a semiconductor substrate comprising a first compound semiconductor material, a buried semiconductor channel material layer comprising a second compound semiconductor material which is different in terms of composition or doping as compared to the first compound semiconductor material and located on a topmost surface of the semiconductor substrate, and a compound semiconductor layer comprising a third compound semiconductor material having a higher band gap than the second compound semiconductor material and located on a topmost surface of the buried semiconductor channel layer, wherein said first, second and third compound semiconductor materials are selected from the group consisting of a III-V compound semiconductor material and a II-VI compound semiconductor material; and
a raised source region and a raised drain region located in areas of the multilayered substrate that are at a footprint of the patterned gate region, wherein both said raised source region and said raised drain region have an upper horizontal surface that is offset from said topmost surface of the multilayered substrate, a lower horizontal surface that is located beneath said topmost surface of said semiconductor substrate, and a pair of upper slanted sidewalls and a pair of lower slanted sidewalls, and wherein each of said upper slanted sidewalls has an end portion that directly contacts an end portion of one of the lower slanted sidewalls beneath said topmost surface of said buried semiconductor channel material layer.

16. The semiconductor structure of claim 15, wherein said buried semiconductor channel material layer comprises a semiconductor material having a different semiconductor composition than the semiconductor substrate.

17. The semiconductor structure of claim 15, wherein said end point of said upper slanted sidewall that directly contacts said end portion of one of the lower slanted sidewalls is aligned to an outer edge of a patterned gate conductor of said patterned gate region, and wherein $L_{effective}$ is less than $L_{gate}$.

18. The semiconductor structure of claim 15, wherein said end point of said upper slanted sidewall that directly contacts said end portion of one of the lower slanted sidewalls is not aligned to an outer edge of a patterned gate conductor of said patterned gate region, and wherein $L_{effective}$ is equal to, or greater than, $L_{gate}$.

19. The semiconductor structure of claim 15, wherein said raised source region and said raised drain region are comprised of a semiconductor material having a same lattice constant as that of the semiconductor substrate.

20. The semiconductor structure of claim 15, wherein said raised source region and said raised drain region are comprised of a semiconductor material having a different lattice constant as that of the semiconductor substrate.

21. The semiconductor structure of claim 15, wherein said semiconductor substrate, said buried semiconductor channel material layer, and said compound semiconductor layer have a lattice structure and orientation that are identical.

22. The semiconductor structure of claim 15, wherein said patterned gate region includes a patterned gate conductor, a patterned gate dielectric material located beneath the patterned gate conductor, and at least one spacer having an edge located on sidewalls of the patterned gate conductor, and a base located on an upper surface of the patterned gate dielectric material.

* * * * *